United States Patent
Jüstel et al.

[11] Patent Number: 6,084,250
[45] Date of Patent: Jul. 4, 2000

[54] WHITE LIGHT EMITTING DIODE

[75] Inventors: Thomas Jüstel; Hans Nikol; Cees Ronda, all of Aachen, Germany

[73] Assignee: U.S. Philips Corporation, New York, N.Y.

[21] Appl. No.: 09/185,006

[22] Filed: Nov. 3, 1998

Related U.S. Application Data

[63] Continuation of application No. PCT/IB98/00219, Feb. 23, 1998.

[30] Foreign Application Priority Data

| Mar. 3, 1997 | [DE] | Germany | 197 08 407 |
| Dec. 18, 1997 | [DE] | Germany | 197 56 360 |

[51] Int. Cl.$^7$ ................................................ H01L 33/00
[52] U.S. Cl. ................... 257/89; 257/98; 257/99; 257/100; 257/103; 313/502; 313/503; 313/504; 313/512
[58] Field of Search ................. 257/89, 98, 99, 257/100, 103; 313/502, 503, 504, 512

[56] References Cited

U.S. PATENT DOCUMENTS 5,813,753  9/1998  Vriens et al. ........................ 313/512

FOREIGN PATENT DOCUMENTS

| 08007614A | 1/1996 | Japan | F21S 1/100 |
| WO9748138 | 12/1997 | WIPO | H01L 33/00 |
| WO9839805 | 9/1998 | WIPO | H01L 33/00 |

*Primary Examiner*—Minh Loan Tran
*Attorney, Agent, or Firm*—John C. Fox

[57] ABSTRACT

A light-emitting device comprising a UV-diode with a primary emission of 300 nm$\leq\lambda\leq$370 nm and a phosphor layer including a combination of a blue-emitting phosphor having an emission band, with 430 nm$\leq\lambda\leq$490 nm, a green-emitting phosphor having an emission band, with 520 nm$\leq\lambda\leq$570 nm and a red-emitting phosphor having an emission band, with 590 nm$\leq\lambda\leq$630 nm, emits high-quality white light. The color-rendering index CRI is approximately 90 at a color temperature of 4000 K. The color rendition depends only on the composition of the three phosphors, not on the relation between converted and non-converted light, and hence can be readily controlled and regulated.

7 Claims, 1 Drawing Sheet

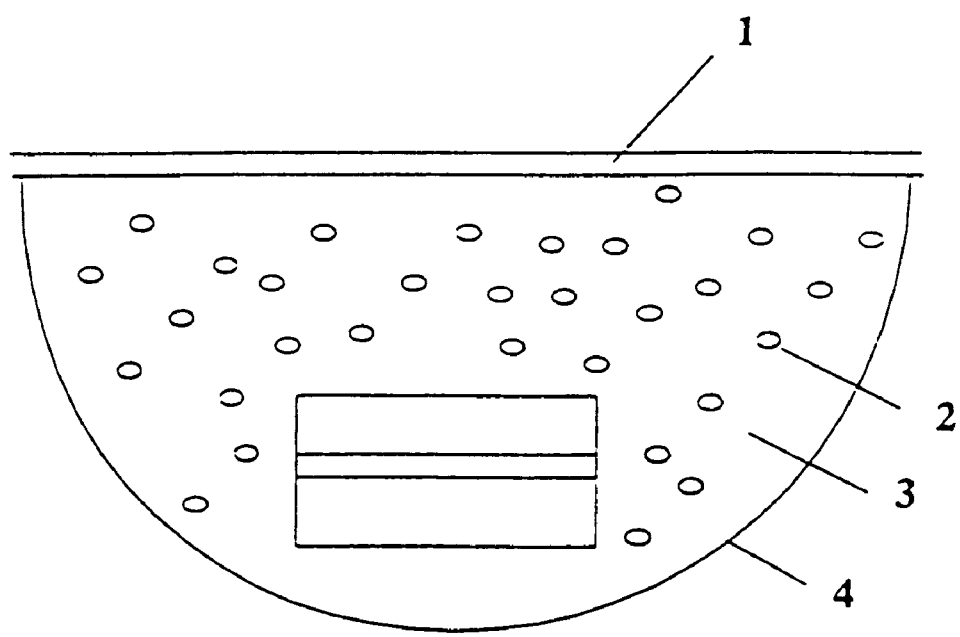

WHITE LIGHT EMITTING DIODE

CROSS REFERENCE TO RELATED APPLICATIONS

This is a continuation of application Ser. No. PCT/IB98/00219, filed Feb. 23, 1998.

BACKGROUND OF THE INVENTION

The invention relates to a light-emitting device for generating white light, which is composed of a light-emitting diode and a phosphor layer.

Light-emitting diodes are used as signal lights, indicating devices, pilot and warning lamps, light transmitters in light barriers, for optocouplers, IR-remote control systems and optical waveguide transmission systems. They offer many advantages relative to other light-emitting components, such as incandescent lamps. Said light-emitting diodes have a long service life, a great resistance to shocks and vibrations, a good modulation capability into the MHz-range, high packing densities, a great switching circuit compatibility and no inrush currents. They require a low operating voltage and have a low power consumption.

However, it has long been a disadvantage of light-emitting diodes for visible light that not all colors of visible light were available with the same luminous intensity. The efficiency of light-emitting diodes decreases as the wavelength decreases, that is from red, via green, to blue. The brightness of red and green light-emitting diodes was very good and was even substantially further improved by using modern manufacturing methods, however, blue light-emitting diodes exhibited a relatively small luminous intensity. Consequently, using simple means it was impossible to achieve a color-neutral white illumination by a combination of light-emitting diodes.

Theoretically, each color of visible light can be generated from short-wave light, i.e. blue, violet and ultraviolet light. To achieve this, the light-emitting diode, which emits short-wave light, is combined with a suitable phosphor, which converts the short-wave light into the desired color, by absorbing said short-wave light and re-radiating light of the other color in a longer-wavelength range.

White light can be generated, for example, by a blue-emitting light-emitting diode if said light-emitting diode is combined with a phosphor which absorbs blue light, converts it and subsequently emits it as light in the yellow-orange range of the spectrum. Said yellow-orange light mixes with the remaining blue light from the light-emitting diode, and the combination of blue and the complementary color yellow results in white light.

For example JP 08007614 A (Patent Abstracts of Japan) discloses a planar light source for which a light-emitting diode is used, which emits blue light and which is combined with a fluorescent layer of an orange-fluorescent pigment, so that the blue light of the diode is observed as white light. A drawback of this light source is that the chromaticity of the white light is influenced substantially by the small amount of the fluorescent pigment in the fluorescent layer and hence is difficult to control. Only at a high color temperature in the range between 8000 and 8600 K, a good color rendition is obtained. If the color temperature is reduced, also the color-rendering index CRI is reduced substantially.

Therefore, it is an object of the invention to provide a light-emitting device for generating white light, the chromaticity rendition of which can be readily regulated and which has a high color-rendering index.

In accordance with the invention, this object is achieved by. a light-emitting device comprising an UV-diode with a primary emission of 300 nm$\leq\lambda\leq$370 nm and a phosphor layer including a combination of a blue-emitting phosphor having an emission band, with 430 nm$\leq\lambda$470 nm, a green-emitting phosphor having an emission band, with 525 nm $\leq\lambda\leq$570 nm, and a red-emitting, europium-containing phosphor having an emission band, with 600 nm$\leq\lambda\leq$630 nm.

The light-emitting device exhibits a high color rendition and, at the same time, a high efficiency because the phosphors absorb the UV-bands with a high efficiency, This is a continuation of application Ser. No. PCT/IB98/00219, filed Feb. 21, 1998. the quantum efficiency is high, i.e. above 90%, and the half-width value of the emission line is small. The light output is high because in the range above 440 nm and below 650 nm, where the sensitivity of the eyes is low, no light emission takes place.

The white light emitted by the light-emitting device is of a high quality. The color-rendering index CRI is approximately 90 at a color temperature of 4000 K. In addition, the color rendition depends only on the composition of the three phosphors, and not on the relation between converted and unconverted light, and can hence be controlled and regulated in a simple manner.

Within the scope of the invention, it is preferred that the red-emitting phosphor is a line emitter having an emission band with a wavelength maximum of 605 nm$\leq\lambda\leq$620 nm.

It is also preferred that the green-emitting phosphor is a line emitter having an emission band with a wavelength maximum of 520 nm$\leq\lambda\leq$570 nm.

It is further preferred that the UV-diode is a GaN diode.

Within the scope of the invention it may be preferred that the phosphor layer comprises a blue-emitting phosphor in a quantity x1 of 0<x1<30% by weight, a green-emitting phosphor in a quantity x2 of 20$\leq$x2$\leq$50% by weight and a red-emitting phosphor in a quantity x3 of 30$\leq$x3$\leq$70% by weight.

It may also be preferred that the phosphor layer comprises $BaMgAl_{10}O_{17}$:Eu as the blue-emitting phosphor, ZnS:Cu as the green-emitting phosphor and $Y_2O_2S$ as the red-emitting phosphor.

Within the scope of the invention it is particularly preferred that the phosphor layer comprises a phosphor of the general formula [Eu(diketonate)$_a$X$_{b1}$X'$_{b2}$] as the red-emitting phosphor, wherein X=pyridine or a monodentate pyridine derivative and X'=2,2'-bipyridine or a 2,2'-bipyridyl derivative and 2a+b$_1$+2b$_2$=8.

These and other aspects of the invention will be apparent from and elucidated with reference to the embodiments described hereinafter.

BRIEF DESCRIPTION OF THE DRAWINGS

In the drawings:

FIG. 1 shows a light-emitting device.

DESCRIPTION FO THE PREFERRED EMBODIMENTS

A light-emitting device in accordance with the invention comprises an UV-diode as the excitation source for the UV-radiation and a phosphor layer, including a mixture of three phosphors, which convert the UV-light of the UV-diode into visible, white light. In the example shown in the drawing, the device is embodied so that the UV-diode is embedded in a semi-spherical bowl of a polymeric material, which is arranged on a transparent substrate (front panel) 1. The three phosphor powders 2 are finely distributed in the polymer 3. The polymer bowl and the phosphor powders together constitute the phosphor layer. The device in accordance with the invention may further comprise mirrors 4 for UV and visible light to improve the decoupling of light. For example, the bowl itself may be embodied so as to be a reflector.

In the simplest case, the light-emitting device comprises an UV-diode and, provided thereon, a transparent coating including the phosphors. The transparent coating may comprise, for example, the phosphors in a solid solution in a transparent matrix of polyacrylate, polystyrene, epoxy resin or another polymer.

Being mass-products, LEDs are customarily encapsulated in an epoxy resin housing, a dome-shaped lens of epoxy resin molded integral with said housing, being used to improve the decoupling of light from the diode. In this embodiment, the phosphors may be provided as a contact layer between the actual diode and the epoxy-resin dome. They may alternatively be provided as a coating on the exterior of the epoxy-resin dome.

Large, two-dimensional, light-emitting devices can be readily manufactured in that a diode array is combined with the phosphor layer in accordance with the invention. For example, the diode array may be covered with a glass plate on which the phosphors are printed.

The UV-diode is, in particular, an UV-diode of InGaN or GaN and has its emission maximum between 370 and 410 nm at a half-width value FWHM<50 nm.

To maintain the light emission, means for applying electric energy to the UV-diode are provided. These means comprise at least two electrodes.

The three phosphors are selected in such a manner that they are excited by the UV-light of the UV-diode and that the red phosphor has a narrow emission line at 590 nm$\leq\lambda\leq$630 nm, the green phosphor has a narrow emission line at 520 nm$\leq\lambda\leq$570 nm, and the blue phosphor has a narrow emission line at 430 mn$\leq\lambda\leq$490 nm. For the blue phosphor use can alternatively be made of a broadband emitter instead of a line emitter having a narrow emission line. The emission lines of the three phosphors may be attuned to each other in a very accurate manner, even when the emissions are not completely independent from each other, since emission flanks partly overlap. As a result, the color co-ordinates of the white light can be accurately set. The phosphors are preferably lanthanide-activated phosphors, for example $Eu^{3+}$-activated phosphors or $Tb^{3+}$-activated phosphors.

For the red phosphors use is preferably made of phosphors of the general formula $[Eu(diketonate)_a X_{b1} X_{b2}']$, wherein X=pyridine or a monodentate pyridine derivative, and X'=2,2'-bipyridine or a 2,2'-bipyridyl derivative, and $2a+b_1+2b_2=8$. These complex co-ordination compounds of europium(III) include $Eu^{3+}$ as the metallic center, diketonates as the anionic chelate ligands and 2,2'-bipyridine or a 2,2'-bipyridyl derivative as the neutral chelate ligands. For the diketonates use is made of pentane-2,4-dithionate (acac), 2,2,6,6-tetramethyl-3,5-heptanedithionate (thd), 1-(2-thenoyl)-4,4,4-trifluoro-1,3-butanedithionate (ttfa), 7,7-dimethyl-1,1,1,2,2,3,3-heptafluoro-4,6-octanedithionate (fod), 4,4,4-trifluoro-1-(2-naphtyl)-1,3-butanedithionate (tfnb), 1,3-diphenyl-1,3-propanedithionate (dpm), for the neutral ligands use is made of X pyridine or of the bidentate ligands 2,2'-bipyridine (bpy), 1,10-phenanthroline (phen), 4,7-diphenyl-1,10-phenanthroline (dpphen), 5-methyl-1,10-phenanthroline (mphen), 4,7-dimethyl-1,10-phenanthroline (dmphen), 3,4,7,8-tetramethyl-1,10-phenanthroline (tmphen), 5-nitro-1,10-phenanthroline (NOphen), 5-chloro-1,10-phenanthroline (Clphen) or dipyridine phenazine (dppz).

Table 1 lists the blue-emitting, green-emitting and red-emitting phosphors for the light-emitting device in accordance with the invention, and the wavelength maximum and absorption at 370 nm of said phosphors.

TABLE 1

| Composition | λ[max] | Absorption at 370 nm [%] | QE at 370 nm |
| --- | --- | --- | --- |
| Blue-emitting phosphors | | | |
| $BaMgAl_{10}O_{17}$:Eu | 450 | 70 | 90 |
| $Sr_5(PO_4)_3Cl$:Eu | 450 | 70 | 90 |
| ZnS:Ag | 450 | 75 | 75 |
| Green-emitting phosphors | | | |
| ZnS:Cu | 550 | 40 | 85 |
| $BaMgAl_{10}O_{17}$Eu, Mn | 515 | 70 | 90 |
| Red-emitting phosphors | | | |
| $Y_2O_2A$:$Eu^{3+}$ | 628 | 30 | 90 |
| $YVO_4$:$Eu^{3+}$ | 620 | 25 | 85 |
| $Y(V,P,B)O_4$:$Eu^{3+}$ | 615 | 25 | 85 |
| $YNbO_4$:$Eu^{3+}$ | 615 | 20 | 90 |
| $YTaO_4$:$Eu_{3+}$ | 615 | 20 | 90 |
| $[Eu(acac)_3(phen)]$ | 611 | 97 | 70 |

By virtue of the mixture in accordance with the invention, a good color-rendering index and a good energy efficiency are obtained. The light-emitting device has a color-rendering index CRI<90 at a color temperature $\geq$4000 K and can hence suitably be used for artificially lighting interiors.

To manufacture the phosphor layer, the three phosphors can be provided as a coating comprising a binder onto the diode surface. For the binder use can be made, for example, of film-forming acrylic polymerizates such as methylacrylate and polystyrene. Alternatively they may be admixed in quantities of micrograms with the epoxy resin of the epoxy-resin dome and be uniformly distributed throughout the epoxy-resin dome. Instead of epoxy resin use may be made of another transparent thermosetting plastic resin. This results in a more diffuse emission of white light. Owing to the high brightness of the light-emitting device, it may be desirable for safety reasons that the light emission is more diffuse.

In operation, the UV-diode generates UV-light having a wavelength $\lambda\leq$370 nm which is incident on the phosphor mixture in the phosphor layer. The phosphors of the mixture absorb the radiation and emit radiation of a longer wavelength, i.e. the phosphors transform the invisible UV-radiation into visible light, which is transformed by the phosphors into visible light. By mixing the three phosphors having different emission lines, light of the desired composition is obtained.

Since the light produced by the light-emitting device in accordance with the invention does not originate from an incandescent body, but instead is generated by the excitation of the phosphors in the phosphor layer, the light output is extremely high. The light-emitting device in accordance with the invention produces a pleasant light having a high color fidelity. The emission lines of the phosphors in the visible range are so closely spaced that a quasi-continuous spectrum is obtained, resulting in a good color rendition.

EXAMPLE 1

A light-emitting device comprising a UV-diode and a phosphor layer including a mixture of the three phosphors was manufactured. For this purpose, use was made of an undoped GaN diode with transparent sapphire as the diode substrate. Said diode substrate was coated with a suspension of three phosphors in different mixing ratios in accordance with Table 2 in a 1% polyvinyl-alcohol solution and baked at 200° C.

TABLE 2

| $T_c[K]$ | $x_1[BaMgAl_{10}O_{17}:Eu]$ | $x_2[ZnS:Cu]$ | $x_3[YVO_4]$ | Ra8 | Phosphor Diode eff.[lm/W] |
| --- | --- | --- | --- | --- | --- |
| 2700 | .04 | .36 | .60 | 85 | 9.7 |
| 3000 | .08 | .37 | .56 | 85 | 9.8 |
| 4000 | .16 | .41 | .43 | 91 | 9.9 |
| 5000 | .22 | .41 | .36 | 92 | 9.6 |
| 6300 | .28 | .43 | .30 | 96 | 9.8 |

EXAMPLE 2

A light-emitting device comprising an UV-diode and a phosphor layer including a mixture of the three phosphors was manufactured. For this purpose, use was made pf an undoped GaN diode with transparent sapphire as the diode substrate. Said diode substrate was coated with a suspension of three phosphors in different mixing ratios in accordance with Table 2 in a 1% polyvinyl-alcohol solution and baked at 200° C.

TABLE 3

| $T_c[K]$ | $x_1[BAM]$ | $x_2[ZnS:Cu]$ | $x_3[Eu(acac)_3(phen)]$ | Ra8 | Phosphor Diode eff.[lm/W] |
| --- | --- | --- | --- | --- | --- |
| 2700 | .06 | .36 | .54 | 82 | 12.0 |
| 3000 | .1 | .37 | .49 | 83 | 11.9 |
| 4000 | .18 | .41 | .37 | 89 | 11.8 |
| 5000 | .25 | .41 | .31 | 91 | 11.4 |
| 6300 | .30 | .43 | .25 | 95 | 11.3 |

EXAMPLE 3

A light-emitting device comprising a UV-diode and a phosphor layer including a mixture of the three phosphors was manufactured. For this purpose, use was made of an undoped GaN diode with transparent sapphire as the diode substrate. Said diode substrate was coated with a suspension of three phosphors in different mixing ratios in accordance with Table 2 in a 1% polyvinyl-alcohol solution and baked at 200° C.

TABLE 4

| $T_c[K]$ | $x_1[BAM]$ | $x_2[ZnS:Cu]$ | $x_3[Y_2O_2S]$ | Ra8 | Phosphor Diode eff.[lm/W] |
| --- | --- | --- | --- | --- | --- |
| 2700 | 0.05 | 0.31 | 0.63 | 85 | 12.2 |
| 3000 | 0.09 | 0.32 | 0.59 | 85 | 12.2 |
| 4000 | 0.16 | 0.38 | 0.46 | 89 | 12.7 |
| 5000 | 0.23 | 0.38 | 0.39 | 90 | 12.5 |
| 6300 | 0.28 | 0.40 | 0.32 | 95 | 12.5 |

What is claimed is:

1. A light-emitting device comprising an UV-diode with a primary emission of 300 nm$\leq \lambda \leq$370 nm and exposed to said emission a phosphor layer comprising a blue-emitting phosphor having an emission band, with 430 nm$\leq \lambda \leq$490 nm, a green-emitting phosphor having an emission band, with 520 nm$\leq \lambda \leq$570 nm, and a red-emitting phosphor having an emission band, with 590 nm$\leq \lambda \leq$630 nm.

2. A light-emitting device as claimed in claim 1, characterized in that the red-emitting phosphor is a emitter having an emission band with a wavelength maximum of 605 nm$\leq \lambda \leq$620 nm.

3. A light-emitting device as claimed in claim 1, characterized in that the green-emitting phosphor is a emitter having an emission band with a wavelength maximum of 520 nm$\leq \lambda \leq$570 nm.

4. A light-emitting device as claimed in claim 1, characterized in that the UV-diode is a GaN diode.

5. A light-emitting device as claimed in claim 1, characterized in that the phosphor layer comprises a blue-emitting phosphor in a quantity x1 of 0<x1<30% by weight, a green-emitting phosphor in a quantity x2 of 20$\leq$x2$\leq$50% by weight and a red-emitting phosphor in a quantity x3 of 30$\leq$x3$\leq$70% by weight.

6. A light-emitting device as claimed in claim 1, characterized in that the phosphor layer comprises $BaMgAl_{10}O_{17}:Eu$ as the blue-emitting phosphor, ZnS:Cu as the green-emitting phosphor and $Y_2O_2S$ as the red-emitting phosphor.

7. A light-emitting device as claimed in claim 1, characterized in that the phosphor layer comprises a phosphor of the general formula $[Eu(diketonate)_a X_{b1} X'_{b2}]$ as the red-emitting phosphor, wherein X=pyridine or a monodentate pyridine derivative and X'=2,2'-bipyridine or a 2,2'-bipyridyl derivative and $2a+b_1+2b_2=8$.

* * * * *